(12) United States Patent
Som et al.

(10) Patent No.: US 12,222,376 B2
(45) Date of Patent: Feb. 11, 2025

(54) PEAK VOLTAGE DETECTION CIRCUIT WITH REDUCED CHARGE LOSS

(71) Applicant: GlobalFoundries U.S. Inc., Malta, NY (US)

(72) Inventors: Indranil Som, West Bengal (IN); Vaibhav Anantrai Ruparelia, Bengaluru (IN); Kuppireddy Vasudeva Reddy, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 290 days.

(21) Appl. No.: 17/815,961

(22) Filed: Jul. 29, 2022

(65) Prior Publication Data

US 2024/0036087 A1    Feb. 1, 2024

(51) Int. Cl.
*G01R 19/04*    (2006.01)
(52) U.S. Cl.
CPC .................................. *G01R 19/04* (2013.01)
(58) Field of Classification Search
CPC ............................. H03K 5/1532; G01R 19/04
USPC ....................... 324/500, 600, 76.11, 105, 104
See application file for complete search history.

(56) References Cited

U.S. PATENT DOCUMENTS 10,931,281 B2 *  2/2021  Delorme ............ G01R 31/3177
11,067,453 B2 *  7/2021  Horng ..................... G01K 7/00
11,984,897 B2 *  5/2024  Kolar ................... H03K 5/1532
2016/0344344 A1 * 11/2016  Bandyopadhyay ......................... H03F 3/45183
2019/0267845 A1 *  8/2019  Maniktala ............... H01F 38/14

OTHER PUBLICATIONS

Caccia et al., "A 60 μW High Linearity CMOS Peak-Stretcher/Discriminator," IEEE Transactions on Nuclear Science, vol. 54, No. 3, Jun. 2007, pp. 538-540.
Dorosz et al., "Low-Power Front-End ASIC for Silicon Photomultiplier," IEEE Transactions on Nuclear Science, vol. 65, No. 4, Apr. 2018, pp. 1070-1078.
Fang et al., "Design and Integration of a High Accuracy Multichannel Analog CMOS Peak Detect and Hold Circuit for APD-Based PET Imaging," IEEE Transactions on Biomedical Circuits and Systems, vol. 6, No. 2, Apr. 2012, pp. 179-187.

(Continued)

*Primary Examiner* — Alexander Satanovsky
*Assistant Examiner* — Trung Q Nguyen
(74) *Attorney, Agent, or Firm* — David Cain; Hoffman Warnick LLC

(57) ABSTRACT

Embodiments of the disclosure provide a peak voltage detection circuit with reduced charge loss. A circuit structure of the disclosure includes a peak voltage detector having a first input node coupled to an input line and a second input node coupled to a first electrically actuated switch. The peak voltage detector coupling the first input node and the second input node to an output node, and a second electrically actuated switch coupling the output node of the peak voltage detector to a capacitor. The first electrically actuated switch couples the capacitor to the second input node of the peak voltage detector. The input line is coupled to a control node of the first electrically actuated switch and a control node of the second electrically actuated switch.

20 Claims, 5 Drawing Sheets

(56) References Cited

OTHER PUBLICATIONS

Ma et al., "A 66-dB Linear Dynamic Range, 100-dB.Ω Transimpedance Gain TIA With High-Speed PDSH for LiDAR," IEEE Transactions on Instrumentation and Measurement, vol. 69, No. 4, Apr. 2020, pp. 1020-1028.

Zheng et al., "A CMOS Peak Detect and Hold Circuit With Auto-Adjust Charging Current for NS-Scale Pulse ToF Lidar Application," IEEE Transactions on Circuits and Systems—I: Regular Papers, vol. 67, No. 12, Dec. 2020, pp. 4409-4419.

* cited by examiner

PEAK VOLTAGE DETECTION CIRCUIT WITH REDUCED CHARGE LOSS

BACKGROUND

1. Technical Field

The present disclosure provides a circuit structure for detecting a peak voltage while reducing charge loss within the circuit.

2. Background Art

Many integrated circuit (IC) architectures include components for detecting and processing of analog input voltages, e.g., components for detecting the amplitude, frequency, period, offset, etc., of analog waveforms. Such circuits may include subsets of components for measuring the desired property(ies) and digitizing the measurements for use within logic and/or data storage. Converting information from analog to digital form may present certain vulnerabilities or potential for error, e.g., when the pre-digitized electrical information is subject to degradation over time. Conventional circuits may avoid degradation by storing voltages temporarily within various energy storage devices such as capacitors. Such components, however, contribute significantly to cost and surface area needed to provide the desired circuitry in a product. Further approaches to mitigating electrical degradation may rely upon external control mechanisms and additional logic, and thus do not sufficiently address the demand for lower surface area and/or fewer components in a product.

SUMMARY

The illustrative aspects of the present disclosure are designed to solve the problems herein described and/or other problems not discussed.

Embodiments of the disclosure provide a circuit structure including: a peak voltage detector having a first input node coupled to an input line and a second input node coupled to a first electrically actuated switch, the peak voltage detector coupling the first input node and the second input node to an output node; and a second electrically actuated switch coupling the output node of the peak voltage detector to a capacitor, wherein the first electrically actuated switch couples the capacitor to the second input node of the peak voltage detector; wherein the input line is coupled to a control node of the first electrically actuated switch and a control node of the second electrically actuated switch.

Other embodiments of the disclosure provide a circuit structure including: a peak voltage detector coupling a first input node and a second input node to an output node; an input line coupled to the first input node of the peak voltage detector; a first electrically actuated switch coupled to the second input node of the peak voltage detector; and a second electrically actuated switch coupling the output node of the peak voltage detector to a capacitor, wherein the first electrically actuated switch and the second electrically actuated switch each include a respective control node coupled to the input line, such that a signal in the input line enables current flow through the first electrically actuated switch and the second electrically actuated switch.

Additional embodiments of the disclosure provide a circuit structure including: a peak voltage detector coupling a first input node and a second input node to and an output node; an input line coupled to the first input node of the peak voltage detector; a first electrically actuated switch coupled to the second input node of the peak voltage detector; a second electrically actuated switch coupling the output node of the peak voltage detector to a capacitor, wherein the first electrically actuated switch and the second electrically actuated switch each include a respective control node coupled to the input line, such that a signal in the input line enables current flow through the first electrically actuated switch and the second electrically actuated switch; a skewed buffer coupling the input line to the control node of the first electrically actuated switch and the control node of the second electrically actuated switch; and a reset transistor having a first source/drain terminal coupled to the second electrically actuated switch, a second source/drain terminal coupled to ground, and a gate terminal coupled to a reset line.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
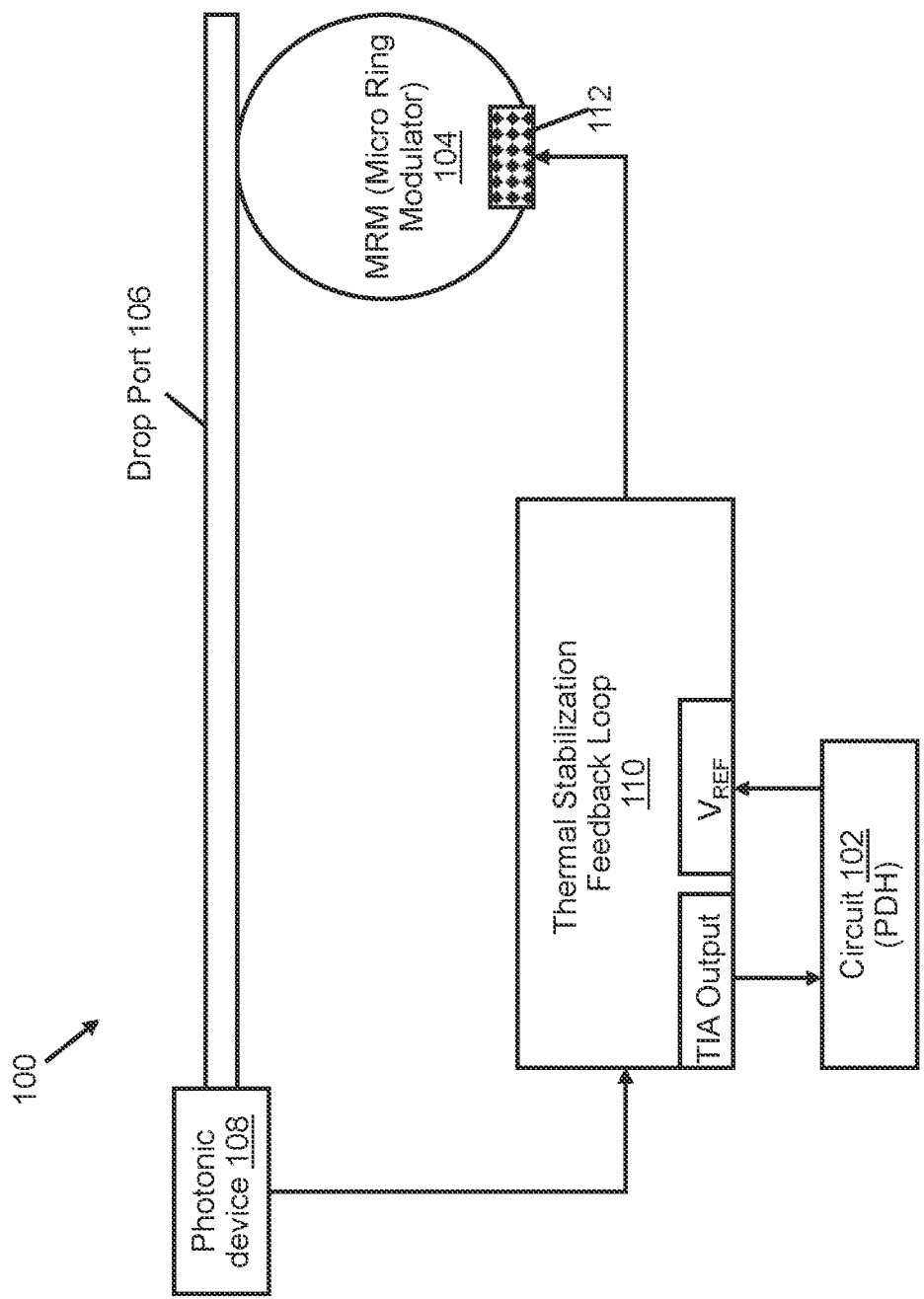
FIG. 1 shows a schematic diagram of a device including a circuit structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a peak voltage detection circuit with reduced charge loss as compared to conventional peak voltage detectors. Conventional circuits may exhibit charge loss in the form of "voltage droop," i.e., a gradual reduction in the stored peak voltage over time. Embodiments of the disclosure provide a peak voltage detector having an input node coupled to an input line through a first electrically actuated switch, and an output node. A capacitor is coupled to the output node of the peak voltage detector through a second electrically actuated switch. The input line is coupled to a control node of the first electrically actuated switch and a control node of the second electrically actuated switch. During operation, the electrically actuated switches may close in response to a detected incoming signal, thus allowing passage of the signal into the peak voltage detection circuit. At the end of the signal pulse, the electrically actuated switches may re-open to disconnect the peak voltage detector and the capacitor from the reset of the circuit, thus retaining the charge stored within the capacitor.

FIG. 1 depicts a schematic view of a device 100 in which embodiments of the disclosure, i.e., a circuit structure (simply "circuit" hereafter) 102 having voltage peak detection and hold ("PDH") features, may be implemented. As discussed elsewhere herein, circuit 102 may include a sub-circuit for sensing of peak voltages and another sub-circuit for holding the magnitude of the detected peak voltage, and various additional components for interconnecting these sub-circuits to each other and/or to input and output nodes of circuit 102. Device 100 may be a temperature stabilization structure for a micro ring modulator (MRM) 104, in which device 100 includes, or is coupled to, circuit 102 to identify the highest voltage amplitude transmitted to or from device 100. Although a temperature stabilization structure may be one type of device 100 usable with circuit 102, it is understood that circuit 102 may be implemented with a variety of contexts and/or other types of devices 100. In various implementations, embodiments of circuit 102 may be implemented in applications such as light detection and ranging (LiDAR), silicon-photonic circuits, nuclear electronics, etc. Regardless of which device(s) 100 are used, circuit 102 senses whether the input voltage approaches this threshold and signals device 100 to temporarily cease operating upon detecting a sufficiently high peak voltage.

As discussed herein, device 100 may be a thermal stabilization structure for MRM 104, i.e., a device for monitoring the temperature of MRM 104 as it operates in a volatile environment to increase or decrease the temperature of MRM 104 during operation. MRM may include a set of four ports, including various input and output ports for receiving and transmitting optical signals passing therethrough. A drop port 106 (i.e., a particular type of output port) may transmit modulated optical signals from MRM 104 to a photonic device 108 coupled thereto. Other ports of MRM 104 are omitted from FIG. 1 solely for clarity of illustration. Photonic device 108 then may interpret and/or process the optical signals transmitted via drop port 106 according to any available mechanism(s) therein.

Device 100 may include a thermal stabilization feedback loop 110 coupled to photonic device 108 (e.g., by one or more temperature sensors such as a proportionate to absolute temperature (PTAT) voltage circuit (not shown)) to monitor the thermal properties of photonic device 108 as it receives signals transmitted from MRM 104 via drop port 106. The function of thermal stabilization feedback loop 110 is to measure the temperature of photonic device 108 as it operates, and to indirectly raise or lower the temperature of photonic device 108 by modifying the operating settings of MRM 104, e.g., by adjusting a thermal tuner 112 configured to regulate the temperature of MRM 104. Thermal stabilization feedback loop 110 may operate in part by relating voltage magnitudes within photonic device 108 with operating temperatures associated with such voltage levels, e.g., using logic, a look up table, and/or various other formulas and/or data within thermal stabilization feedback loop 110. Further mechanisms for monitoring and adjusting the temperature(s) of MRM 104 and/or photonic device 108 are known in the art and thus not described in further detail herein. Thermal stabilization feedback loop 110 may use a transimpedance amplifier (TIA) or similar current-to-voltage converter to indicate the operating voltage of photonic device 108. Thermal stabilization feedback loop may transmit such an output ("TIA output" in FIG. 1) to circuit 102, which in turn transmits a reference voltage via a reference voltage line ("$V_{REF}$" in FIG. 1). The reference voltage line $V_{REF}$ indicates the highest value ("peak") voltage within the voltage waveform provided to circuit 102.

Figure 2:
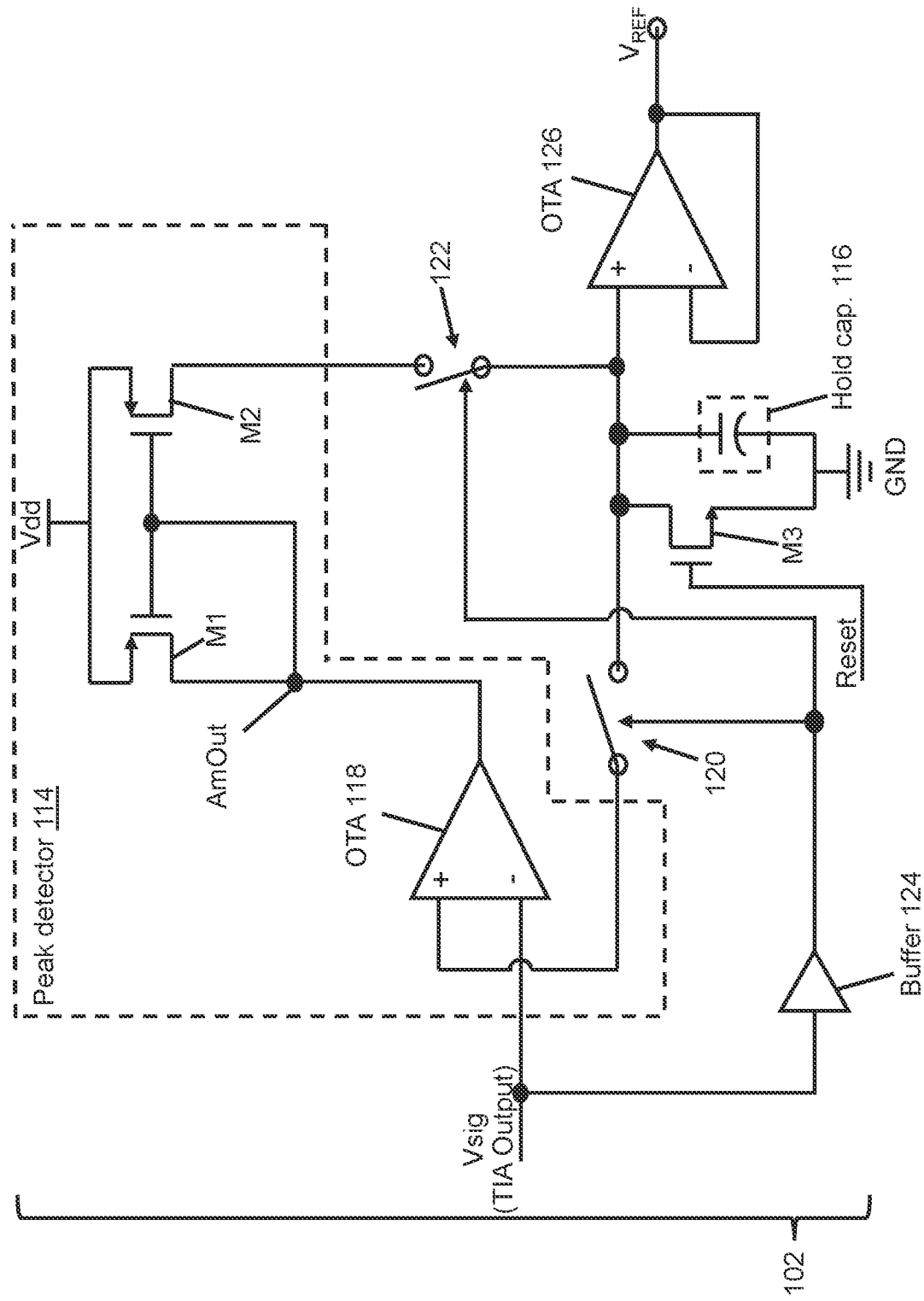
FIG. 2 shows a schematic diagram of a circuit structure according to embodiments of the disclosure.

FIG. 2 depicts a schematic diagram of circuit 102 to illustrate structural features thereof for reducing charge loss according to embodiments of the disclosure. As shown, circuit 102 has an input line "Vsig" coupled to thermal stabilization feedback loop 110 (FIG. 1) to receive a voltage signal therefrom (e.g., TIA output of FIG. 1 discussed herein). Input line "Vsig" may be the sole input signal provided to circuit 102, and thus the only input pathway from thermal stabilization feedback loop 110 to circuit 102. A reference voltage line $V_{REF}$ provides an electrical output from circuit 102, carrying a peak voltage signal to thermal stabilization feedback loop 110. Circuit 102 may include a peak voltage detector circuit ("peak detector") 114 coupling an input line Vsig of circuit 102 to a hold capacitor ("hold cap.") 116 coupled between peak detector 114 and the output node of circuit 102. The capacitance of hold capacitor 116 may be set to a particular value to reduce manufacturing costs and/or parasitic charging during operation.

According to an example, hold capacitor 116 may have a capacitance of at most approximately sixty picofarads (pF). Various other components of circuit 102 for capturing the peak voltage detected by peak detector 114, storing the peak voltage in hold capacitor 116, and transmitting the peak voltage via reference voltage line $V_{REF}$ are discussed in more detail herein.

Peak detector 114 may include a first operational transconductance amplifier ("OTA") 118 coupling to a first input node of peak detector 114 (i.e., at input line Vsig), and a second input node (i.e., at one terminal of a first electrically actuated switch 120) to an amplifier output node ("AmOut"). OTA 118 is an amplifier configured for producing an output current based on the difference of its input voltages (e.g., Vsig at one input and the output from peak detector 114 at the other input), multiplied by a conversion factor known as the "transconductance" of OTA 118. The output from OTA 118 may be coupled to amplifier output node AmOut. Amplifier output node AmOut, in turn, is coupled to the source or drain of a first transistor M1, as well as the gate terminals of first transistor M1 and a second transistor M2. In this configuration, current flow through transistors M1, M2 will not be enabled unless the output current from OTA 118 is of a threshold value for activating transistors M1, M2. The other source/drain terminal of first transistor M1 may be coupled to a supply voltage (Vdd) for circuit 102, such that supply voltage is coupled between source/drain terminals of first transistor M1 and second transistor M2 as shown. The other source or drain terminal of second transistor M2 in turn may be coupled to a second electrically actuated switch 122. The threshold voltage to actuate first electrically actuated switch 120 and second electrically actuated switch 122 may be defined based on supply voltage Vdd, e.g., it may be a predetermined voltage difference of one half Vdd. In a specific example, the voltage to actuate switches 120, 122 may be approximately fifty millivolts greater than one half of supply voltage Vdd. Thus, supply voltage Vdd and switches 120, 122 may prevent miniscule signal pulses from input line Vsig from activating peak detector 114 and hold capacitor 116.

First electrically actuated switch 120 and second electrically actuated switch 122 each may include two terminals (i.e., an input and output terminal denoted by open circles in FIG. 2) and a control node (indicated with an arrow in FIG. 2) for controlling whether each switch 120, 122 opens or closes. In some cases, electrically actuated switches 120, 122 may take the form of a field effect transistor (FET) or another voltage controlled device, a bipolar junction transistor (BJT) or other current controlled device, and/or electrically operated components for switching or otherwise electrically controlling current flow between two terminals. However embodied, electrically actuated switches 120, 122 may create open circuit junctions except when a sufficiently high current or voltage is transmitted to each control node thereof. Transmitting at least a threshold voltage or threshold current to the control node of each electrically actuated switch 120, 122 may cause each switch 120, 122 to close the connection through its first and second terminals.

A skewed buffer ("buffer") 124 may electrically couple input line Vsig to the control node of each electrically actuated switch 120, 122. Buffer 124 may take the form of a component for delaying a signal transmitted therethrough without significantly affecting the amplitude, frequency, or other properties of signals transmitted therethrough. Buffer 124 may include, e.g., a group of serially intercoupled inverters. Buffer 124 may be known as a "skewed" electrical element because it delays the timing of signals passing therethrough, and thus desynchronizes the transmitted signal relative to a clock signal for driving the input signal (Vsig) to circuit 102. Electrically actuated switches 120, 122 may be in an open state when the voltage of their control nodes is below a threshold value. A rising and/or peak incoming voltage may increase the voltage of input line Vsig to a magnitude that is sufficient to actuate (i.e., close) electrically actuated switches 120, 122. Buffer 124 may delay incoming signals to account for any time needed for incoming signals Vsig to pass through peak detector 114, including OTA 118 and transistors M1, M2 therein. Thus, electrically actuated switches 120, 122 and buffer 124 may only allow incoming signals to circuit 102 to pass through peak detector 114 when they are at least of a minimum current or frequency magnitude.

Second electrically actuated switch 122 may couple the output of peak detector 114 to additional components for holding, resetting, and/or transmitting the detected peak voltage(s) back to thermal stabilization feedback loop 110 via reference voltage line $V_{REF}$. Hold capacitor 116 may electrically couple the second terminal of second electrically actuated switch 122 to ground ("GND"), such that the voltage leaving peak detector 114 is converted into a charge stored in hold capacitor 116. Due to the presence of switches 120, 122 in circuit 102, no signals will pass to hold capacitor 116 from peak detector 114 when electrically actuated switches 120, 122 are open. In addition, the charge stored in hold capacitor 116 will not leak through peak detector 114 when electrically actuated switches 120, 122 are open. A third transistor M3 may be coupled to ground in parallel with hold capacitor 116, and a gate terminal of third transistor M3 may be coupled to a "reset" line for selectively enabling or disabling source to drain current flow through third transistor M3. When current flow through third transistor M3 is disabled, the charge in hold capacitor 116 will be retained. When current flow through third transistor M3 is enabled, the charge in hold capacitor 116 will dissipate to ground, and hence the peak voltage will be reset.

Hold capacitor 116 may be coupled to reference voltage line $V_{REF}$ through a second transconductance amplifier ("OTA2") 126 that is coupled to reference voltage line $V_{REF}$. The output current may be derived from, e.g., the charge stored in hold capacitor 116, as discussed herein. Thus, any charge lost from hold capacitor 116 will negatively affect the accuracy of the peak voltage signal transmitted through reference voltage line $V_{REF}$. Embodiments of circuit 102 thus prevent charge loss from hold capacitor 116 by including electrically actuated switches 120, 122 to prevent current flow from hold capacitor 116 into peak detector 114 when a voltage peak is not being transmitted to circuit 102.

Figure 3:
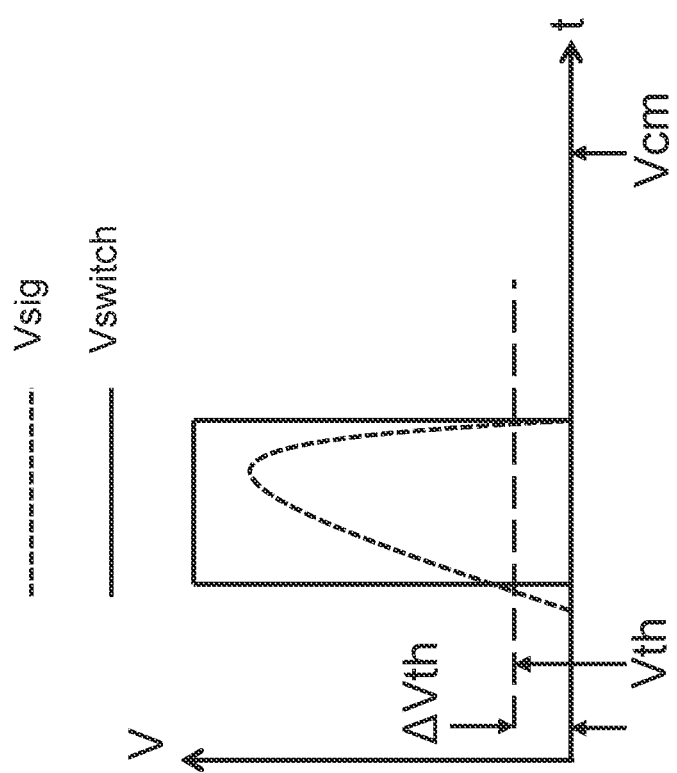
FIG. 3 shows an illustrative plot of peak voltage detection by operation of a circuit structure according to embodiments of the disclosure.

FIG. 3, discussed herein in conjunction with the schematic diagram of FIG. 2, further illustrates the function of electrically actuated switches 120, 122 in circuit 102. As discussed herein, each electrically actuated switch 120, 122 includes a control node for determining whether switch 120, 122 is closed (i.e., conductive) or open (i.e., non-conductive). A threshold voltage "Vth" of each electrically actuated switch 120, 122 defines the minimum control node voltage for closing electrically actuated switch 120, 122. An input voltage signal may be provided to circuit 102 at input line Vsig as discussed in detail elsewhere herein. The voltage in input line Vsig in the illustrated plot initially may be at an initial value or "common node" ("Vcm") but rises to a peak value before sharply returning to the common mode value. The difference between the common mode voltage and threshold voltage is designated by variable "ΔVth" in FIG. 3.

As shown in FIG. 3, the increase to the voltage of input line Vsig initially may have no effect on the voltage level of the control node until it exceeds threshold voltage Vth. Buffer 124 may be included in circuit 102 as discussed herein such that the voltage Vswitch applied to the control nodes of switches 120, 122 is substantially simultaneous with the voltage of input line Vsig exceeding threshold voltage Vth. As a result, the voltage (Vswitch) applied to the control node of switches 120, 122 does not rise above threshold voltage Vth until after voltage of input line Vsig exceeds threshold voltage Vth. The time delay of buffer 124 may be adjusted to better synchronize the increase and decrease in voltage Vswitch with when input line Vsig exceeds or falls below threshold voltage Vth. FIG. 3 thus illustrates that current flow through electrically actuated switches 120, 122 is permitted concurrently with when the voltage of input line Vsig exceeds threshold voltage Vth.

Figure 4:
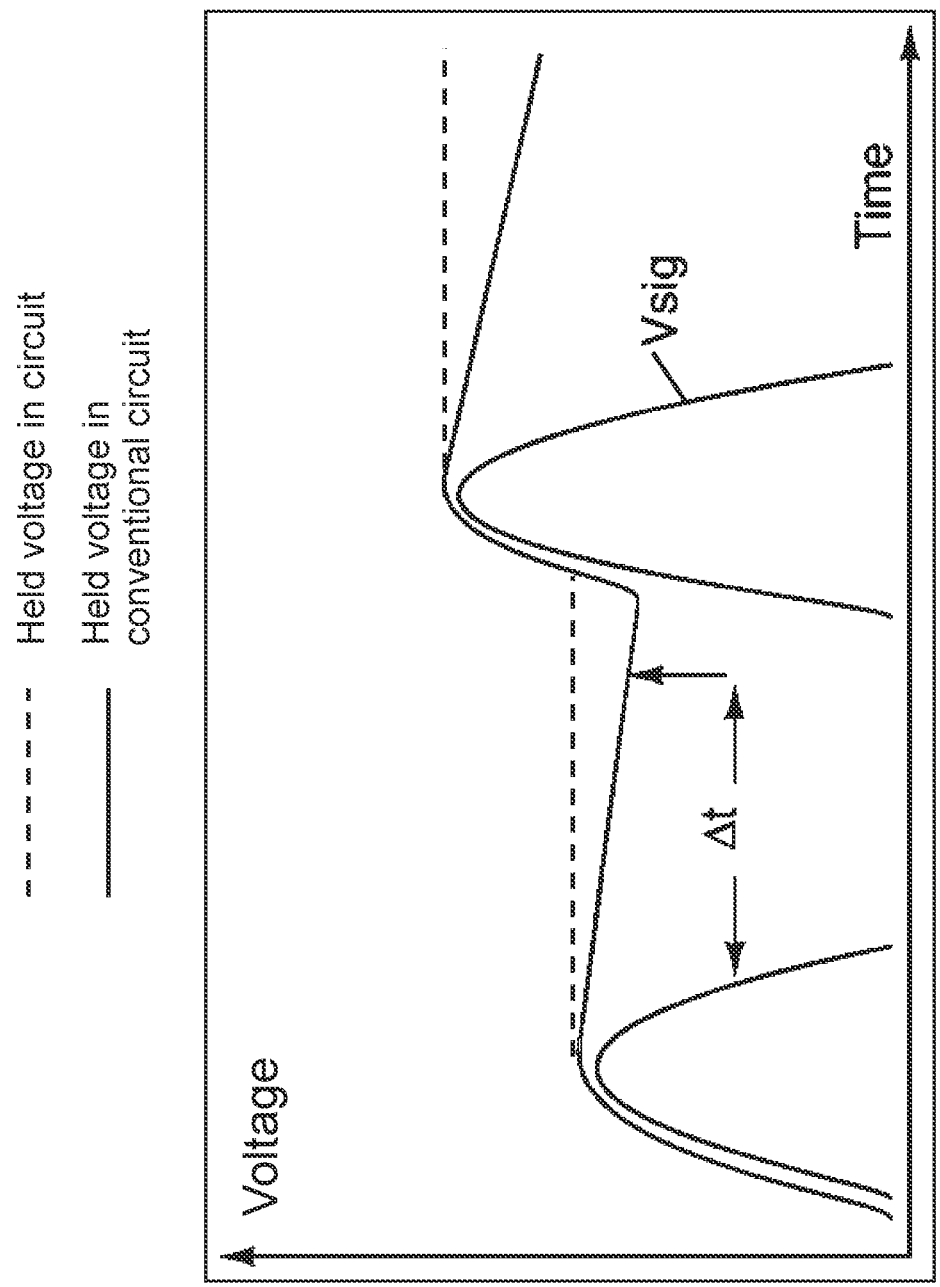
FIG. 4 shows a plot of peak detection and hold (PDH) circuit outputs according to embodiments of the disclosure as compared with a conventional circuit.

FIG. 4, discussed in conjunction with FIG. 2, depicts a comparative plot of voltage versus time for circuit 102 over an illustrative operating period. The illustrative operating period may include two signal pulses to input line Vsig, separated from each other by a time difference ($\Delta t$) as shown. Circuit 102 receives these two pulses at input line Vsig such that peak detector 114 detects the peak voltage in input line Vsig and hold capacitor 116 stores the peak voltage by being coupled to peak detector 114. The second solid line in FIG. 4 illustrates, for sake of comparison, the voltage stored in a hold capacitor of a conventional PDH circuit. When circuit 102 according to embodiments of the disclosure is not implemented, the voltage stored in a conventional PDH circuit will decay significantly over time, e.g., due to parasitic currents and charge losses through any couplings to the rest of a device through a peak detector and/or other components. This gradual delay in stored voltage of a PDH circuit is known as "voltage droop." By contrast, the dotted line illustrates the stored voltage in hold capacitor 116 of circuit 102 for the same two signal pulses. In embodiments of the disclosure, electrically actuated switches 120, 122 will substantially prevent charge loss and/or other parasitic losses from hold capacitor 116 by creating open circuits where charge could otherwise dissipate from hold capacitor 116.

Figure 5:
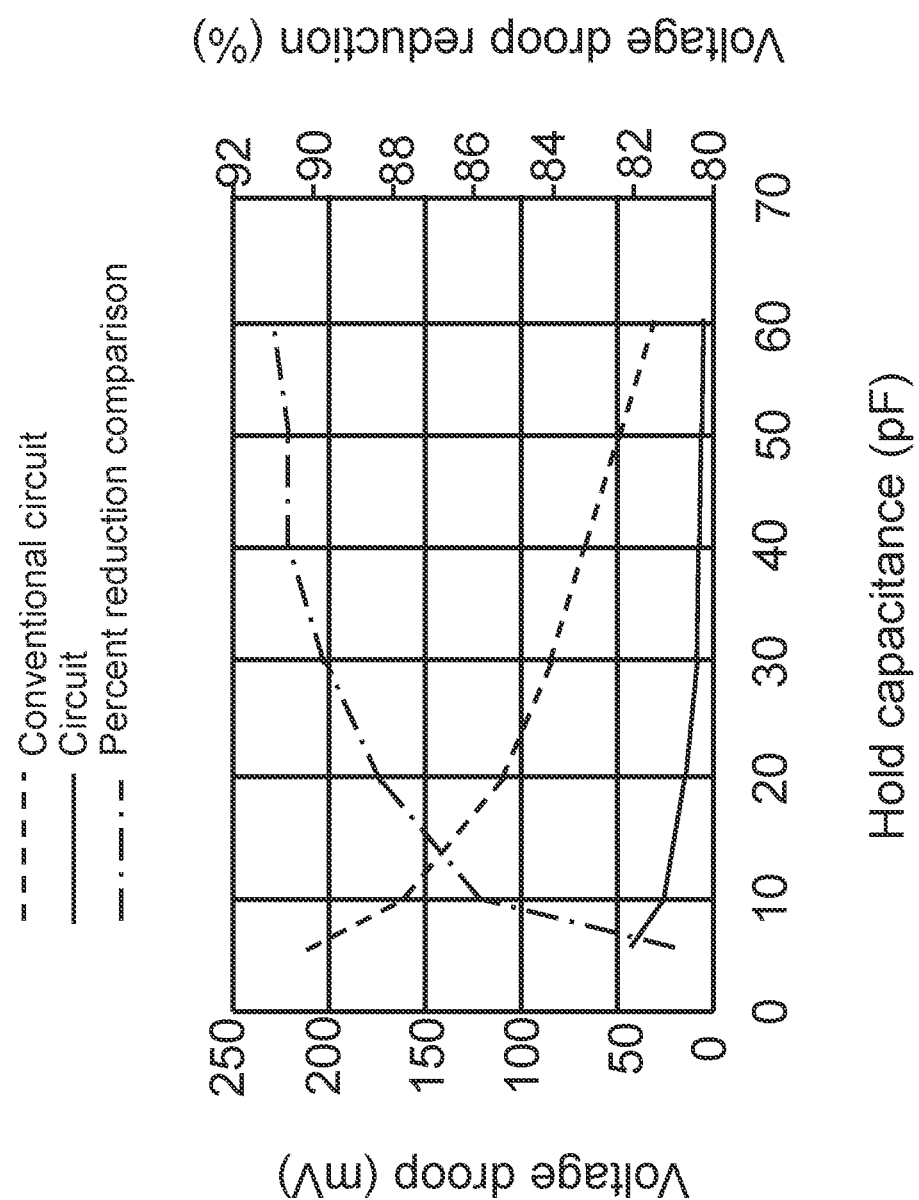
FIG. 5 shows a comparative plot of voltage droop for a circuit structure according to embodiments of the disclosure as compared with a conventional circuit structure.

FIG. 5 provides another illustrative plot comparing voltage droop for several capacitance values for hold capacitor 116. In the comparative plot, hold capacitances of the same value are implemented in an embodiment of circuit 102 and a conventional PDH circuit to compare the amount of voltage droop for each device. The solid line illustrates voltage droop versus hold capacitance for circuit 102, the dashed line illustrates voltage droop versus hold capacitance for a conventional PDH circuit, and the dot-dash line illustrates the percent reduction in voltage droop for circuit 102 relative to the conventional PDH circuit for the same hold capacitance. Applicants have determined that embodiments of circuit 102 provide substantially less voltage droop than conventional PDH circuits even when using the same hold capacitor in each type of circuit. Moreover, increasing the capacitance of hold capacitor 116 in circuit 102 produces further reductions in voltage droop in circuits with higher capacitance hold capacitors 116. By contrast, the voltage droop in a conventional circuit will increase significantly as the hold capacitance increases. As shown, implementing a hold capacitor 116 of at least approximately 30 pF with electrically actuated switches 120, 122 in peak detector 114 produces at least a ninety percent reduction in voltage droop. This voltage droop reduction arises, e.g., from the ability to open any electrical connections between peak detector 114 and hold capacitor 116 when an increase to input line Vsig is not detected.

Embodiments of the disclosure may provide several technical advantages, examples of which are discussed herein. Advantages of the disclosure provide significantly less voltage droop in a PDH circuit without changing the hold capacitance of hold capacitor 116, e.g., by way of electrically actuated switches 120, 122. Electrically actuated switches 120, 122, moreover, eliminate the need for complex external switching logic by using the incoming voltage signal to directly influence whether current can or cannot flow from peak detector 114 to hold capacitor 116. In turn, the use of electrically actuated switches 120, 122 prevents the need to transmit and process a clock signal to embodiments of circuit 102. These and other aspects of circuit 102 discussed herein impose significantly less surface area and power requirements on device 100, regardless of the applicable technical settings.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A circuit structure comprising:
   a peak voltage detector having a first input node coupled to an input line and a second input node coupled to a first electrically actuated switch, the peak voltage detector coupling the first input node and the second input node to an output node; and
   a second electrically actuated switch coupling the output node of the peak voltage detector to a capacitor, wherein the first electrically actuated switch and the second electrically actuated switch are configured in a half-bridge arrangement, and the first electrically actuated switch directly couples the capacitor to the second input node of the peak voltage detector;
   wherein the input line is coupled to a control node of the first electrically actuated switch and a control node of the second electrically actuated switch.

2. The circuit structure of claim 1, further comprising a skewed buffer coupling the input line to the control node of the first electrically actuated switch and the control node of the second electrically actuated switch.

3. The circuit structure of claim 1, wherein the peak voltage detector includes:
   a first operational transconductance amplifier coupling the first input node and the second input node to an amplifier output node;
   a first transistor having a gate terminal coupled to the amplifier output node, and source/drain terminals coupling the amplifier output node to a supply voltage; and
   a second transistor having a gate terminal coupled to the amplifier output node, and source/drain terminals coupling the supply voltage to the output node of the peak voltage detector.

4. The circuit structure of claim 1, further comprising a reset transistor having a first source/drain terminal coupled to the second electrically actuated switch, a second source/drain terminal coupled to ground, and a gate terminal coupled to a reset line.

5. The circuit structure of claim 1, further comprising a second operational transconductance amplifier coupling the capacitor to a reference voltage line.

6. The circuit structure of claim 1, wherein the capacitor has a capacitance of at most sixty picofarads (pF) and a voltage droop of at most 230 millivolts (mV).

7. The circuit structure of claim 1, wherein the input line provides a sole input signal transmitted to the peak voltage detector, the control node of the first electrically actuated switch and the control node of the second electrically actuated switch.

8. A circuit structure comprising:
   a peak voltage detector coupling a first input node and a second input node to an output node, wherein the peak voltage detector includes,
      a first operational transconductance amplifier coupling the first input node and the second input node to an amplifier output node,
      a first transistor having a gate terminal coupled to the amplifier output node, and source/drain terminals coupling the amplifier output node to a supply voltage, and
      a second transistor having a gate terminal coupled to the amplifier output node, and source/drain terminals coupling the supply voltage to the output node of the peak voltage detector;
   an input line coupled to the first input node of the peak voltage detector;
   a first electrically actuated switch coupled to the second input node of the peak voltage detector; and
   a second electrically actuated switch coupling the output node of the peak voltage detector to a capacitor,
   wherein the first electrically actuated switch and the second electrically actuated switch each include a respective control node coupled to the input line, such that a signal in the input line enables current flow through the first electrically actuated switch and the second electrically actuated switch.

9. The circuit structure of claim 8, further comprising a skewed buffer coupling the input line to the control node of the first electrically actuated switch and the control node of the second electrically actuated switch.

10. The circuit structure of claim 8, wherein the first electrically actuated switch and the second electrically actuated switch are configured in a half-bridge arrangement.

11. The circuit structure of claim 8, further comprising a reset transistor having a first source/drain terminal coupled to the second electrically actuated switch, a second source/drain terminal coupled to ground, and a gate terminal coupled to a reset line.

12. The circuit structure of claim 8, further comprising a second operational transconductance amplifier coupling the capacitor to a reference voltage line.

13. The circuit structure of claim 8, wherein the capacitor has a capacitance of at most sixty picofarads (pF) and a voltage droop of at most 230 millivolts (mV).

14. The circuit structure of claim 8, wherein the input line provides a sole input signal transmitted to the peak voltage detector, the control node of the first electrically actuated switch, and the control node of the second electrically actuated switch.

15. A circuit structure comprising:
   a peak voltage detector coupling a first input node and a second input node to and an output node;
   an input line coupled to the first input node of the peak voltage detector;
   a first electrically actuated switch coupled to the second input node of the peak voltage detector;
   a second electrically actuated switch coupling the output node of the peak voltage detector to a capacitor,
   wherein the first electrically actuated switch and the second electrically actuated switch are configured in a half-bridge arrangement, and the first electrically actuated switch directly couples the capacitor to the second input node of the peak voltage detector;
   wherein the first electrically actuated switch and the second electrically actuated switch each include a respective control node coupled to the input line, such that a signal in the input line enables current flow through the first electrically actuated switch and the second electrically actuated switch;

a skewed buffer coupling the input line to the control node of the first electrically actuated switch and the control node of the second electrically actuated switch; and a reset transistor having a first source/drain terminal coupled to the second electrically actuated switch, a second source/drain terminal coupled to ground, and a gate terminal coupled to a reset line.

16. The circuit structure of claim 15, wherein the peak voltage detector includes:

a first operational transconductance amplifier coupling the first input node and the second input node to an amplifier output node;

a first transistor having a gate terminal coupled to the output node, and source/drain terminals coupling the amplifier output node to a supply voltage; and a second transistor having a gate terminal coupled to the amplifier output node, and source/drain terminals coupling the supply voltage to the output node of the peak voltage detector.

17. The circuit structure of claim 16, wherein the supply voltage defines threshold voltage for actuating the first electrically actuated switch and the second electrically actuated switch.

18. The circuit structure of claim 15, further comprising a second operational transconductance amplifier coupling the capacitor to a reference voltage line.

19. The circuit structure of claim 15, wherein the capacitor has a capacitance of at most sixty picofarads (pF) and a voltage droop of at most 230 millivolts (mV).

20. The circuit structure of claim 15, wherein the input line provides a sole input signal transmitted to the peak voltage detector, the control node of the first electrically actuated switch and the control node of the second electrically actuated switch.

* * * * *